US009589896B2

(12) United States Patent  
Armini

(10) Patent No.: US 9,589,896 B2  
(45) Date of Patent: Mar. 7, 2017

(54) ELECTROLESS METAL DEPOSITION ON A MANGANESE OR MANGANESE NITRIDE BARRIER

(71) Applicant: IMEC VZW, Leuven (BE)

(72) Inventor: Silvia Armini, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/067,033

(22) Filed: Mar. 10, 2016

(65) Prior Publication Data

US 2016/0268208 A1 Sep. 15, 2016

(30) Foreign Application Priority Data

Mar. 13, 2015 (EP) .................................... 15159051

(51) Int. Cl.
| | | |
|---|---|---|
| *H01L 21/00* | (2006.01) |
| *H01L 23/532* | (2006.01) |
| *C23C 18/12* | (2006.01) |
| *C23C 18/20* | (2006.01) |
| *H01L 21/768* | (2006.01) |

(52) U.S. Cl.
CPC ........ *H01L 23/53238* (2013.01); *C23C 18/12* (2013.01); *C23C 18/20* (2013.01); *H01L 21/76847* (2013.01)

(58) Field of Classification Search
CPC ......... H01L 23/53238; H01L 21/76847; C23C 18/20

See application file for complete search history.

(56) References Cited

U.S. PATENT DOCUMENTS 7,285,674 B2 * 10/2007 Palma .................... B82Y 30/00  
                                              546/14  
7,514,353 B2      4/2009 Weidman et al.  
(Continued)

FOREIGN PATENT DOCUMENTS

BE        EP 3067439 A1 *  9/2016  ....... H01L 21/76847  
WO     WO 2006/102180 A2    9/2006

OTHER PUBLICATIONS

Armini et al., "Materials Engineering for Future Interconnects: "Catalyst-Free" Electroless Cu Deposition on Self-Assembled Monolayer Alternative Barriers", *Journal of the Electrochemical Society*, 157 (1) D74-D80 (2010).

(Continued)

*Primary Examiner* — Laura Menz  
(74) *Attorney, Agent, or Firm* — Knobbe Martens Olson & Bear, LLP

(57) ABSTRACT

An electronic circuit structure comprising a substrate, a dielectric layer on top of the substrate and comprising a cavity having side-walls, a manganese or manganese nitride layer covering the side-walls, and a self-assembled monolayer, comprising an organic compound of formula Z-L-A, covering the manganese or manganese nitride layer, wherein Z is selected from the list consisting of a primary amino group, a carboxylic acid group, a thiol group, a selenol group and a heterocyclic group having an unsubstituted tertiary amine in the cycle, wherein L is an organic linker comprising from 1 to 12 carbon atoms and from 0 to 3 heteroatoms, and wherein A is a group attaching the linker to the manganese or manganese nitride layer.

18 Claims, 5 Drawing Sheets

(56) References Cited

U.S. PATENT DOCUMENTS

| | | | |
|---|---|---|---|
| 7,770,437 B2* | 8/2010 | Frederix | B05D 1/185 |
| | | | 134/18 |
| 8,569,165 B2 | 10/2013 | Gordon et al. | |
| 8,652,962 B2 | 2/2014 | Singh et al. | |
| 8,736,055 B2 | 5/2014 | Kolics et al. | |
| 2004/0018532 A1* | 1/2004 | Frederix | B05D 1/185 |
| | | | 506/15 |
| 2006/0251800 A1* | 11/2006 | Weidman | B82Y 30/00 |
| | | | 427/99.5 |
| 2011/0163062 A1* | 7/2011 | Gordon | C23C 16/18 |
| | | | 216/13 |
| 2014/0252620 A1* | 9/2014 | Huang | H01L 23/53238 |
| | | | 257/751 |
| 2015/0380302 A1* | 12/2015 | Mountsier | H01L 21/76831 |
| | | | 438/654 |
| 2016/0056071 A1* | 2/2016 | Draeger | H01L 23/53238 |
| | | | 438/653 |
| 2016/0095212 A1* | 3/2016 | Lee | H01L 21/26506 |
| | | | 174/251 |
| 2016/0268208 A1* | 9/2016 | Armini | H01L 21/76847 |

OTHER PUBLICATIONS

Au et al., "Selective Chemical Vapor Deposition of Manganese Self-Aligned Capping Layer for Cu Interconnections in Microelectronics", *Journal of The Electrochemical Society*, 157 (6) D341-D345 (2010).

Semaltianos et al., "Copper chemical vapour deposition on organosilane-treated SiO2 surfaces", Applied Surface Science 222 (2004) 102-109.

* cited by examiner

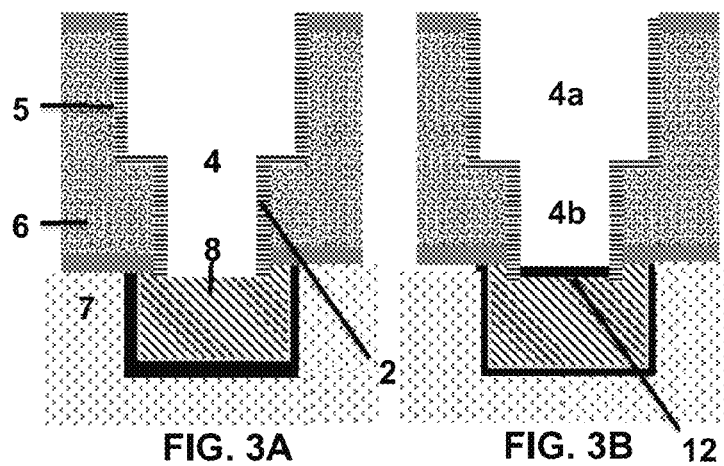
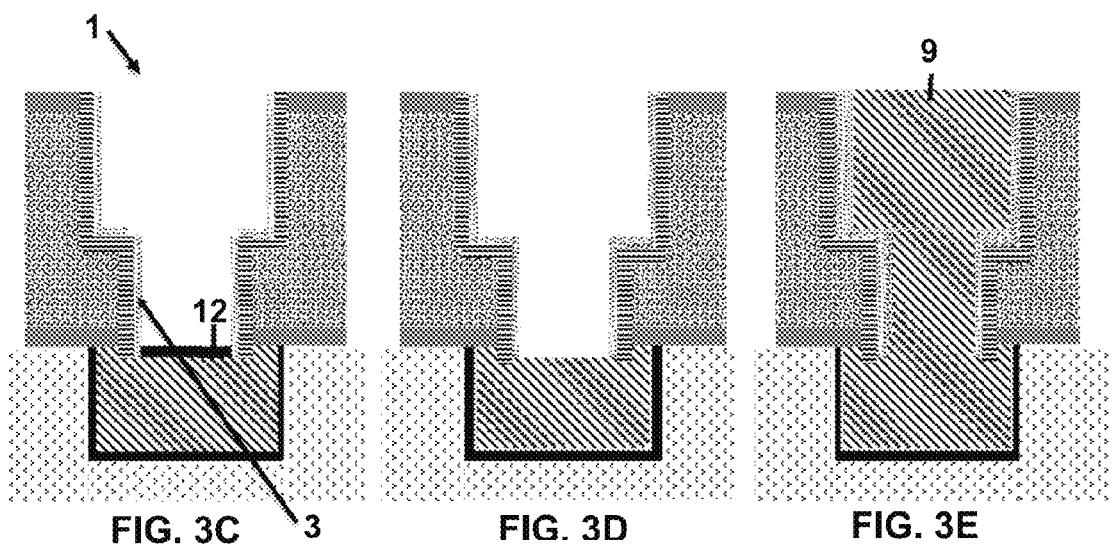
FIG. 3A  FIG. 3B  FIG. 3C  FIG. 3D  FIG. 3E

ELECTROLESS METAL DEPOSITION ON A MANGANESE OR MANGANESE NITRIDE BARRIER

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of European Application No. EP 15159051.0 filed Mar. 13, 2015. The aforementioned application is incorporated by reference herein in its entirety, and is hereby expressly made a part of this specification.

TECHNICAL FIELD

Processes for forming metal interconnects within semiconductor devices are provided.

BACKGROUND

Copper (Cu) is now becoming the standard material for connecting transistors in semiconductor devices. However, such devices cannot function properly if Cu diffuses into them. For instance, Cu reduces the resistance of the dielectric material insulating the interconnections. This leads to transistor threshold voltage shifts and reliability problems. For this reason, Cu must be confined inside diffusion barriers.

The copper-based formation of interconnects typically uses a so-called "damascene" process flow. This is a metal inlay process flow wherein, first trenches are etched in the inter-level dielectric layer (e.g. an oxide), then a thin layer is deposited on top of the inter-level dielectric layer in such a way as to cover the side walls of the trenches to prevent copper diffusion, next a seed layer is deposited to provide a conductive layer, which is required for the electroplating deposition process of the copper. Next, copper is electroplated. After electroplating, a chemical mechanical planarization step is performed to remove the excess copper and to polish the wafer. Then, a barrier layer is deposited to cover the top of the copper inlays, such that copper is fully encapsulated within the barrier material. Nowadays, both vias and trenches are simultaneously etched into the inter-layer dielectric and then simultaneously filled. This process is named dual-damascene.

CVD manganese (Mn) and manganese nitride (MnNx) are currently investigated as very promising barriers for the damascene/dual damascene formation of interconnects. For thicknesses down to 1 nm, their barrier properties and time dependent dielectric breakdown have been proven adequate on $SiO_2$ patterned structures. Unfortunately, metal adherence and in particular copper adherence to these barriers is problematic.

Electrochemical metal plating on manganese or manganese nitride barriers is not an advantageous option to achieve the controlled filling of trenches having a width lower than 25 nm or lower than 15 nm because of the necessary presence of a relatively thick PVD Cu seed layer on top of the Mn barrier which would act as plating seed layer and more importantly protect the Mn barrier from dissolving in the plating bath. To the best of our knowledge, electroless metal deposition has never been demonstrated on Mn or MnNx barrier. For instance, electroless Cu deposition on Mn or MnNx was considered impossible due to the dissolution of Mn in the metallization bath. U.S. Pat. No. 8,569,165 discloses an interconnect structure for electronic circuits. In certain embodiments, manganese or manganese nitride is deposited via chemical vapor deposition or atomic layer deposition as a barrier layer against the diffusion of copper, oxygen and water. Next, a seed layer of Cu is formed, preferably by a conformal method such as CVD, ALD or PVD. Then the vias and trenches are filled by electrochemical deposition, followed by annealing. Examples show the filling of trenches having a width of about 30 nm. No electroless filling is disclosed which is not surprising since it was considered up to now as impossible. There is therefore still a need in the art for method overcoming one or more of the inconveniences mentioned above.

SUMMARY

It is an object to provide good apparatus or methods for electroless filling cavities having manganese or manganese nitride on their side walls with a metal.

It is an advantage of embodiments that manganese or manganese nitride-coated cavities of small width can be filled with a metal such as copper.

It is an advantage of embodiments that the filling with a metal such as copper of a cavity coated with manganese or manganese nitride can be achieved by the use of an interfacial self-assembled monolayer of very low thickness, thereby largely preserving the electrical properties (e.g. conductivity) of the metal filling.

It is an advantage of embodiments that a good adherence can be achieved between a manganese or manganese nitride layer and a metal filling such as copper.

It is an advantage of embodiments that a metal filling having a smooth surface can be achieved on top of a manganese or manganese nitride layer.

It is an advantage of embodiments that cavities coated with a manganese or manganese nitride layer can be filled with a metal such as copper without introducing voids between the manganese or manganese nitride layer and the metal filling.

The above objective is accomplished by a method and device according to the present embodiments.

It has been realized that very good metal growth can be achieved on a manganese or manganese nitride surface by using a self-assembled monolayer comprising an organic compound of formula Z-L-A as an interface between the manganese or manganese nitride layer and the metal to be grown. This is especially useful in the field of microelectronics where vias and trenches of ever decreasing dimensions must be filled with metal (typically copper) to form interconnections.

In a first aspect, an electronic circuit structure is provided, comprising a substrate, a dielectric layer on top of the substrate and comprising a cavity having side-walls, a manganese or manganese nitride layer covering the side-walls, and a self-assembled monolayer, comprising an organic compound of formula Z-L-A, covering the manganese or manganese nitride layer, wherein Z is selected from the list consisting of a primary amino group, a carboxylic acid group, a thiol group, a selenol group and a heterocyclic group having an unsubstituted tertiary amine in the cycle, wherein L is an organic linker comprising from 1 to 12 carbon atoms and from 0 to 3 heteroatoms, and wherein A is a group attaching the linker to the manganese or manganese nitride layer.

The electronic circuit structure is a structure suitable for use in an electronic circuit. It is preferably a microelectronic circuit structure.

The dielectric layer is on top of the substrate. This means that it can be overlying the substrate and be in direct contact therewith or that it can be separated from the substrate by one or more layers. If it is separated from the substrate by one or more layers, the cavity preferably extends in the dielectric layer and in the one or more layers separating it from the substrate.

The substrate can be any supporting solid layer.

In embodiments, the substrate may comprise a semiconductor substrate. In that case, the electronic circuit structure can be referred to as a semiconductor structure. A device comprising such a semiconductor structure can be referred to as a semiconductor device. In embodiments, the substrate may be a semiconductor substrate such as a Si or Ge wafer.

In embodiments, the substrate may comprise a dielectric supporting layer.

Typically the cavity also has a bottom. In embodiments, the bottom of the cavity may be made of a dielectric material and the manganese or manganese nitride layer may also cover the bottom. This could for instance be the case if the cavity is a trench in a dielectric wherein this trench will be filled with a metal to form conductive lines. In other embodiments, the bottom of the cavity may comprise or be made of a conductive material such as for instance a metal (e.g. copper or tungsten) and the manganese or manganese nitride layer does not cover the bottom.

In embodiments, the substrate may have a conductive element at a surface thereof and the cavity may be exposing at least part of the conductive element. The conductive element may be present to enable interconnection. For instance, it can be a conductive line or a conductive contact. In these embodiments, the substrate may for instance be a semiconductor substrate (e.g. at the M0 metallization level when the conductive element may belong to an active device at the semiconductor substrate surface) or a dielectric supporting layer (e.g. at the Mi metallization level wherein i is an integer when the conductive element belongs to an interconnect structure situated above the M0 metallization level).

The presence of the conductive element is prone to trigger a bottom-up filling of the cavity.

In embodiments, the conductive element may be embedded in the substrate in such a way that a top surface of the conductive element is co-planar with a top surface of the substrate.

In embodiments, the conductive element may be made of a metal such as for instance copper or tungsten. These metals are typically used to form interconnections.

In embodiments, a manganese nitride layer is preferred over a manganese layer. Manganese nitride layers are more mechanically and chemically resistant and resists better to chemical-mechanical treatments such as the chemical mechanical planarization (CMP) typically performed on the structure after that the cavity has been filled with the metal (e.g. copper). Typically, the metal overfills the cavity and a CMP step is performed to remove the excess metal. This step, however, easily damages the manganese layer while a manganese nitride layer resists that step better.

In embodiments, the manganese or manganese nitride layer may have an atomic ratio Mn:N of from 5:1 to 1:1, preferably from 4:1 to 2:1.

In embodiments, the manganese or manganese nitride layer may have a thickness of from 0.5 to 1.5 nm, preferably from 0.5 to 1 nm. Such a thickness is enough to assure adequate barrier properties and remains sufficiently small to assure an as large as possible filling with the metal of choice (typically copper).

The self-assembled monolayer is in direct contact with the manganese or manganese nitride layer and is chemically bound thereto via the group A.

The self-assembled monolayer covering the manganese or manganese nitride layer preferably consists in organic compounds of formula Z-L-A.

An example of heterocyclic group having an unsubstituted tertiary amine in the cycle is a pyridine group.

Z is preferably selected from the list consisting of a primary amino group, a carboxylic acid group, a thiol group, and a selenol group.

Z is more preferably selected from a primary amino and a carboxylic acid group, and is most preferably a primary amino group. Carboxylic acid groups (and especially primary amino groups) have demonstrated the best ability in assuring adhesion of the metal layer and, when a $Pd^{2+}$ catalyst solution was used on the manganese or manganese nitride layer, the best reduction of the $Pd^{2+}$ into $Pd^{\circ}$.

L is a radical that can be straight or branched but it is preferably straight.

L may comprise cyclic moieties such as aromatic moieties but it preferably does not comprise cyclic moieties.

L may be saturated or not but is preferably saturated.

The heteroatoms in L are preferably selected from oxygen and nitrogen atoms and are most preferably nitrogen atoms. In particular, the presence of primary or secondary amino groups in L further enhance the capability of the monolayer to assure adhesion of the metal layer and to reduce the $Pd^{2+}$ into $Pd^{\circ}$.

In embodiments, the linker L may comprise from 1 to 3 Z' groups wherein Z' shares the definition of Z. Having Z' groups in the linker L is advantageous as it provides a higher density of groups in the self-assembled monolayer having an affinity for metals. This enhances metal adhesion and hence facilitates metal deposition and/or growth.

Z' is preferably a primary amino group.

In embodiments, the linker L may comprise at least one secondary amino group. This is advantageous as it permits improvement of the chemical bond with $Pd^{2+}$ which is reduced in-situ to $Pd^{\circ}$ when a $Pd^{2+}$ catalyst solution is used.

Z-L-A is typically obtained by reacting Z-L-A' (as defined below) on the manganese or manganese nitride layer. Similarly, A is typically obtained by reacting A' (as defined below) on the manganese or manganese nitride layer.

A preferred family of Z-L-A is compounds of general formula $NH_2$-L-$SiX_3$ wherein L comprises from 0 to 2 secondary amino groups and preferably from 1 to 2 secondary amino groups in its main chain linking $NH_2$ to $SiX_3$.

In embodiments, the electronic circuit structure may further comprise one or more metal layers provided on the self-assembled monolayer. The purpose of the self-assembled monolayer is to enable the provision of one or more layers of good quality thereon. The first of these one or more metal layers to be provided on the self-assembled monolayer is in direct contact therewith.

In embodiments, one of the one or more metal layers may be a catalyst layer provided on the self-assembled monolayer. A preferred catalyst is palladium (Pd). Preferably, the Pd layer is a $Pd^{\circ}$ metal layer. Other possible catalysts are Pt, Ru, Co, Au, and Ag metal layers. The catalysts are deposited in solution as metal complexes (reduced in-situ upon reaction with the self-assembled monolayer, with or without assistance of an activator) or metallic nanoparticles or by vapor deposition techniques such as evaporation, sputtering, CVD or ALD. In embodiments, one of the one or more metal layers may be a cobalt- or nickel-comprising layer deposited on the catalyst layer if present or on the self-assembled monolayer of no catalyst layer is present. A nickel-comprising layer is preferred.

In embodiments, the thickness of the nickel- or cobalt-comprising layer may be from 0.5 to 1.5 nm and is preferably from 0.5 to 1.0 nm. Such a thickness is sufficient to promote the growth of a smooth copper layer while simultaneously being thin enough to only marginally reduce the conductivity of the one or more metal layers (e.g. forming the filling of the cavity).

In embodiments, one of the one or more metal layers is a Cu layer deposited on the cobalt- or nickel-comprising layer if present, on the Pd layer if no cobalt- nor nickel-comprising layer is present, or on the self-assembled monolayer (3) if no cobalt- or nickel-comprising layer nor Pd layer is present. In preferred embodiments, the Cu layer may fill the cavity (or what remains from it after Pd, and cobalt- or nickel-comprising layer deposition) entirely.

In embodiments, no voids are present between the manganese or manganese nitride layer and the one or more metal layers.

In a second aspect, a process is provided for manufacturing a structure according to any embodiment of the first aspect, comprising the steps of: providing a structure covered at least partially by a manganese or manganese nitride layer, and covering the manganese or manganese nitride layer with a self-assembled monolayer comprising an organic compound of formula Z-L-A', wherein A' is a group suitable for attaching the linker to the manganese or manganese nitride layer.

In embodiments, the structure comprises a substrate and a dielectric layer covering the substrate and having a cavity having side walls.

In an embodiment of the second aspect, a process is provided for manufacturing an electronic circuit structure comprising the steps of: a) providing a substrate, b) forming a dielectric layer comprising a cavity having side-walls on top of the substrate, c) covering the side-walls with a manganese or manganese nitride layer, and d) covering the manganese or manganese nitride layer with a self-assembled monolayer comprising an organic compound of formula Z-L-A', wherein A' is a group suitable for attaching the linker to the manganese or manganese nitride layer.

In embodiments, step a) may comprise step a1) of providing a substrate to be cleaned, step a2) of cleaning with a reactive oxygen species the substrate at least where the manganese or manganese nitride layer will cover the substrate, and step a3) of covering the cleaned substrate at least partially with a manganese or manganese nitride layer.

In embodiments, the reactive oxygen species may be selected from an $O_2$ plasma and an $O_3$ gas exposed to UV radiation.

In embodiments, step c) may comprise overlaying the manganese or manganese nitride layer on the side walls by chemical vapor deposition. The advantage of this method is that it is conformal.

In embodiments, the self-assembled monolayer may comprise an organic compound selected from p-(aminoethyl-aminomethyl) phenethyltrimethoxysilane and (3-trimethoxysilylpropyl) diethylenetriamine.

In embodiments, step d may be performed by contacting the substrate with a solution of the organic compound of formula Z-L-A'. In these embodiments, the contacting may for instance last from 1 to 10 hours. In embodiments, the solution may have a concentration in the organic compound of formula Z-L-A' of from 1 mM to 100 mM. The solvent may be any solvent suitable for dissolving the organic compound of formula Z-L-A'. An example of solvent suitable in some embodiments is methanol.

In embodiments, the organic compound of formula Z-L-A' is deposited from a vapor phase. In these embodiments, the substrate may be contacted with the vapor phase for from 15 to 60 min. The temperature within the deposition chamber may be for instance from 100° C. to 180° C., preferably from 120° C. to 160° C. For instance, 140° C. is suitable in some embodiments. The pressure of the deposition chamber may for instance be from 4 to 20 mbar, preferably from 6 to 15 mbar. For instance, 10 mbar is suitable in some embodiments. The volume of organic compound of formula Z-L-A' that is vaporized can be for instance from 20 to 500 µl, preferably from 40 to 300 µl, more preferably from 50 to 150 µl. For instance, 100 µl is suitable in some embodiments. An example of suitable conditions for a self-assembled monolayer (DETA) is a vapor phase formed in a deposition chamber at 140° C. and 10 mbar from 100 µl of DETA.

In embodiments, the organic compound Z-L-A' may have a length of from 0.5 to 1 nm.

In embodiments, the process may further comprise the step of contact the self-assembled monolayer with a base, preferably an organic base such as an amine base. An example of suitable amine base is diisopropylethylamine. We observed that contacting the self-assembled monolayer with a base does not deteriorate the manganese or manganese nitride layer, does not deteriorate the self-assembled monolayer and protects the manganese or manganese nitride layer against its dissolution during step e (see below).

In embodiments, the process may further comprise a step of providing one or more metal layers on the self-assembled monolayer. For instance, the process may further comprise the steps of e. Optionally providing a catalyst layer (e.g. a Pd layer) on the self-assembled monolayer, f. Depositing a cobalt- or nickel-comprising layer on the catalyst layer if present, and g. Depositing Cu on the cobalt- or nickel-comprising layer if present or on the self-assembled monolayer if no cobalt- or nickel-comprising layer is present.

In embodiments, step e may comprise contacting the self-assembled monolayer with a $Pd^{2+}$ complex solution having pH≥7 or with a liquid medium comprising $Pd^{\circ}$ nanoparticles. Examples of suitable $Pd^{2+}$ complexes are tetraamminepalladium (II) salts such as tetraamminepalladium (II) sulfate, tetraamminepalladium (II) dichloride, tetraamminepalladium (II) hydroxide. It is an advantage of embodiments that the self-assembled monolayer, especially when Z is selected from primary amino and carboxylic groups, permits to activate $Pd^{2+}$ into $Pd^{\circ}$ without the need of using a separate activation step with an activator (typically a reducers having a redox potential suitable for reducing $Pd^{2+}$ into $Pd^{\circ}$) such as dimethylamine borane, $NaBH_4$, hydrazine or the activator "BI" from LAM Research. Such an activator may however nevertheless be used by contacting the structure with the activator after a step of contacting it with a $Pd^{2+}$ solution. We could demonstrate that such an activator had no detrimental effect on the manganese or manganese nitride layer.

In embodiments, in step e, the $Pd^{2+}$ solution is preferably at a pH above 2, and more preferably at a pH of 7 or more (e.g. pH from 7 to 12).

In embodiments, in step e, the substrate may be contacted with a liquid medium comprising $Pd^{\circ}$ nanoparticles and Z may be selected from a thiol group, a selenol group and a heterocyclic group having an unsubstituted tertiary amine in the cycle. Thiol, selenol groups, and heterocyclic group having an unsubstituted tertiary amine in the cycle have more affinity for Pd° while primary amino or carboxylic groups are best suited for forming Pd° from a Pd$^{2+}$ solution.

In embodiments, step e may be performed by contacting the substrate with Pd by chemical vapor deposition.

In embodiments, step f and/or step g may be performed by electroless deposition.

In embodiments, the nickel-comprising layer may be selected from nickel boron (NiB) and nickel phosphorus (NiP) alloy. Suitable are for instance nickel layers that are alloyed with from 1 to 12 wt. % phosphorus or with from 1 to 5 wt. % boron.

In embodiments, the cobalt- or nickel-comprising layer may have a thickness of from 0.3 to 1 nm.

In embodiments, A' may be selected from SiX$_3$ and PO$_3$H$_2$ groups wherein each X is independently selected from H, Cl, O—CH$_3$, O—C$_2$H$_5$, and O—C$_3$H$_7$. These groups were observed to be best suited to attach to the manganese or manganese nitride layer.

In embodiments, the process may further comprise annealing of the copper layer.

In embodiments, the substrate may comprise a conductive element at a surface thereof and the cavity may expose at least partially the conductive element. In these embodiments, the process may further comprise i. providing a sacrificial protective layer on the exposed conductive element prior to providing the self-assembled monolayer on the manganese or manganese nitride layer, ii. Removing the sacrificial protective layer after having covered the manganese or manganese nitride layer with a self-assembled monolayer (3), and iii. Filling the cavity with a metal.

An advantage of the presence of the sacrificial protective layer is that on one hand, it prevents deterioration of the exposed conductive element, and on another hand, it prevents the Z'-L-A compounds to adhere to the exposed conductive element. For instance, if the exposed conductive element is prone to oxidation (e.g. if it is made of copper), the sacrificial protective layer will protect the conductive element from oxidation.

In embodiments, the sacrificial protective layer may be a self-assembled monolayer comprising molecules having a part capable to attach to the conductive element and a part preventing attachment of any subsequent self-assembled monolayer. An example of suitable sacrificial protective layer is a self-assembled monolayer comprising alkylthiol or alkyselenol molecules. For instance, the alkyl chain may comprise from one to 20 carbon atoms.

Removing the sacrificial protective layer can be done in any appropriate way well known to the person skilled in the art. If the conductive element is made of copper and the sacrificial protective layer is an alkylthiol, removing the sacrificial protective layer can be performed by heating it to a temperature of at least 150° C.

In embodiments, the process may comprise the steps of:

1. Providing a substrate comprising a metal surface and a dielectric material covering the metal surface, 2. Forming a cavity in the dielectric material in order to expose the metal surface, wherein the cavity has side walls, 3. Providing a manganese or manganese nitride layer on the side walls, 4. Providing a sacrificial protective layer on the exposed metal surface, 5. Providing a self-assembled monolayer on the manganese or manganese nitride layer, 6. Removing the sacrificial protective layer, 7. Filling the cavity with a metal.

Other aspects relate to semiconductor devices comprising an electronic circuit structure according to any embodiment of the first aspect and to integrated circuits comprising an electronic circuit structure according to any embodiment of the first aspect.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIGS. 3A-E show intermediate steps in a process according to an embodiment of the second aspect.

Figure 1:
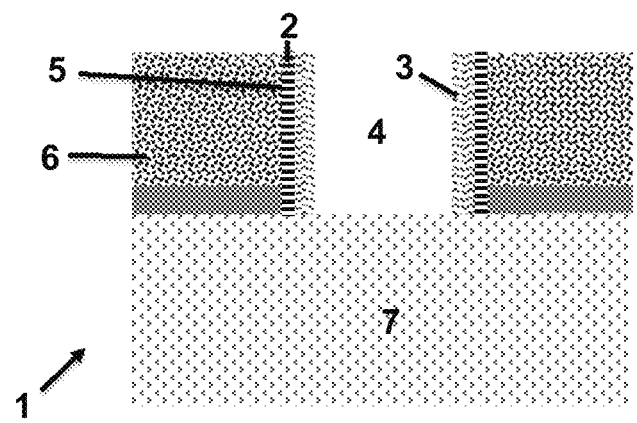
FIG. 1 is a schematic representation of a vertical cross-section of a semi-conductor structure according to an embodiment.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

FIG. 1 is a schematic representation of a vertical cross-section through an electronic structure 1 according to an embodiment. FIG. 1 shows an electronic circuit structure 1 comprising a and a dielectric layer 6 on top of the substrate 7. The dielectric layer 6 comprises a cavity 4 (here a trench extending below and above the plane of the drawing) having side-walls 5. The dielectric layer 6 is typically a silicon oxide (such as $SiO_2$) or a low-k dielectric. Typically, a layer of dielectric 6 is provided on the substrate 7, then the cavity 4 is patterned in the dielectric layer 6. A manganese or manganese nitride layer 2 covers the side-walls 5. The manganese or manganese nitride is typically deposited by Chemical Vapor Deposition. After deposition of the manganese or manganese nitride layer 2, an annealing step is typically performed. A self-assembled monolayer 3 comprising compounds of formula Z-L-A as defined in any embodiment covers the manganese or manganese nitride layer 2.

Figure 2:
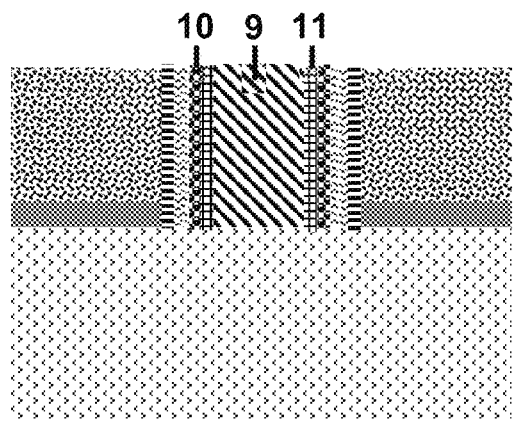
FIG. 2 is a schematic representation of a vertical cross-section of a metalized semi-conductor structure according to an embodiment.

FIG. 2 shows the electronic circuit structure 1 further comprising metal layers 10, 11, and 9 provided on the self-assembled monolayer 3. One of the metal layers 10, 11, 9 is a catalyst layer 10 (here a Pd layer 10) provided on the self-assembled monolayer 3. This Pd layer 10 is typically provided by contacting the self-assembled monolayer 3 with an alkaline $Pd^{2+}$ complex solution. Another of the metal layers 10, 11, 9 is a Co or Ni layer 11 deposited on the Pd layer 10. The procedure for electroless deposition of Co and Ni layers on a Pd° layer is well known to the person skilled in the art. Yet another of the metal layers 10, 11, 9 is a Cu layer 9 deposited on the Co or Ni layer 11 and filling the rest of the cavity 4.

Figure 4:
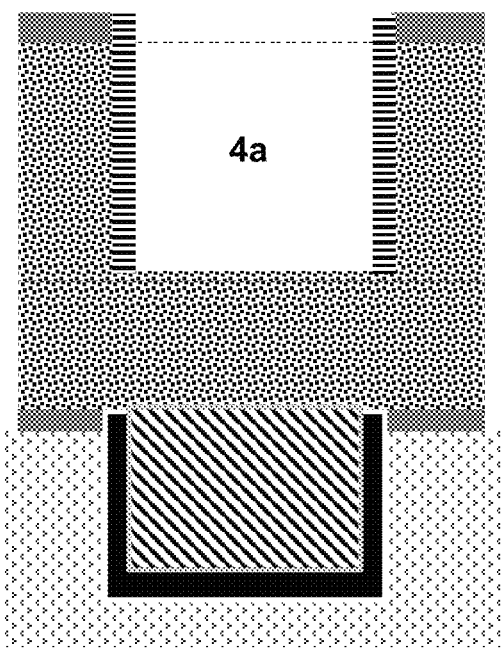
FIG. 4 is vertical cross-sections taken perpendicularly to the longitudinal extent of a trench-shaped opening 4a but away from a via-shaped opening 4b.

FIGS. 3A-E show steps in the manufacture of an electronic circuit structure 1 according to embodiments. FIGS. 3A-E are vertical cross-sections taken perpendicularly to the longitudinal extent of a trench-shaped opening 4a and through a via-shaped opening 4b (see FIG. 3B). FIG. 4 is vertical cross-sections taken perpendicularly to the longitudinal extent of the same trench-shaped opening 4a but away from the via-shaped opening 4b. FIG. 3A shows a substrate 7 (e.g. a semiconductor substrate in the case of M0 metallization or a dielectric substrate in the case of a Mi metallization) having a conductive element 8 at a surface thereof. Here the conductive element 8 is embedded in the substrate 7 in such a way that a top surface of the conductive element 8 is co-planar with a top surface of the substrate 7. The conductive element 8 can for instance be in tungsten or in copper. A dielectric layer 6 is on top of the surface and comprises a cavity 4 having side-walls 5, wherein the cavity 4 is exposing at least part of the conductive element 8. A manganese or manganese nitride layer 2 is covering the side-walls 5. Providing this manganese or manganese nitride layer 2 on the side-walls 5 is typically performed by chemical vapor deposition, followed by annealing.

In FIG. 3B, a sacrificial protective layer 12 is provided on the exposed surface of the conductive element 8. This sacrificial protective layer 12 is typically composed of molecules having a part capable to attach to the conductive element and a part preventing attachment of any subsequent self-assembled monolayer 3 (such as the self-assembled monolayer 3 comprising a compound of formula Z-L-A). The molecules composing the sacrificial protective layer 12 can for instance be alkylthiols. A particular example is 1-decanethiol.

In FIG. 3C, a self-assembled monolayer 3 comprising an organic compound of formula Z-L-A is provided on the manganese or manganese nitride layer 2. The sacrificial protective layer 12 prevents the group A from interacting with the conductive element 8 and thereby permits a better selectivity of the self-assembled monolayer 3 toward the manganese or manganese nitride layer 2. It also limits the oxidation of the conductive element 8. An example of a self-assembled monolayer 3 is for instance a layer consisting of aminosilanes such as $NH_2(CH_2)_3Si(OCH_3)_3$. The polar group Z (e.g. a primary amino group) lessens the dissolution of the manganese or manganese nitride layer 2 during a subsequent metal deposition step and promotes adhesion of the one or more metal layers. For instance, the Pd 10 deposition step typically dissolves the manganese or manganese nitride layer 2. Furthermore, the polar group Z, when it is selected from a primary amino group and a carboxylic acid group promotes the attachment of the $Pd^{2+}$ catalyst to be reduced into $Pd^{0}$. In FIG. 3D the sacrificial protective layer 12 is removed thermally. The sacrificial protective layer 12 is preferably selected in such a way that it can be removed without removal of the self-assembled monolayer 3. This is typically the case if the sacrificial protective layer 12 attaches to the conductive element via a thiol group or a selenol group. In FIG. 3E, a metal 9 is grown in the cavity 4. This metal 9 is typically grown by electroless deposition. The metal 9 typically grown is copper. Electroless copper growth can be performed in several ways. One way, comprising Pd 10 deposition and Co or Ni 11 deposition before Cu 9 deposition, results in a structure analogous to the structure of FIG. 2. Another way comprises growing the Cu 9 directly on the self-assembled monolayer 3. This can for instance be performed by using a plating solution comprising a copper salt, a complexing agent and a reducing agent. A surfactant can also be added. For instance the plating solution can comprise 4 mM $CuSO_4$, 10 mM EDTA disodium salt dehydrate for chelation, and 10 mM formaldehyde as a reducing agent. The solution pH can for instance be adjusted to 12.8 with sodium hydroxide before the addition of formaldehyde. The electroless solution is preferably used immediately after preparation at room temperature. The electroless metal deposition is typically faster from the bottom of the cavity (which comprise and preferably consists in the conductive element 8) than from the side-walls. As a result, the growth is mostly bottom-up.

Figure 8:
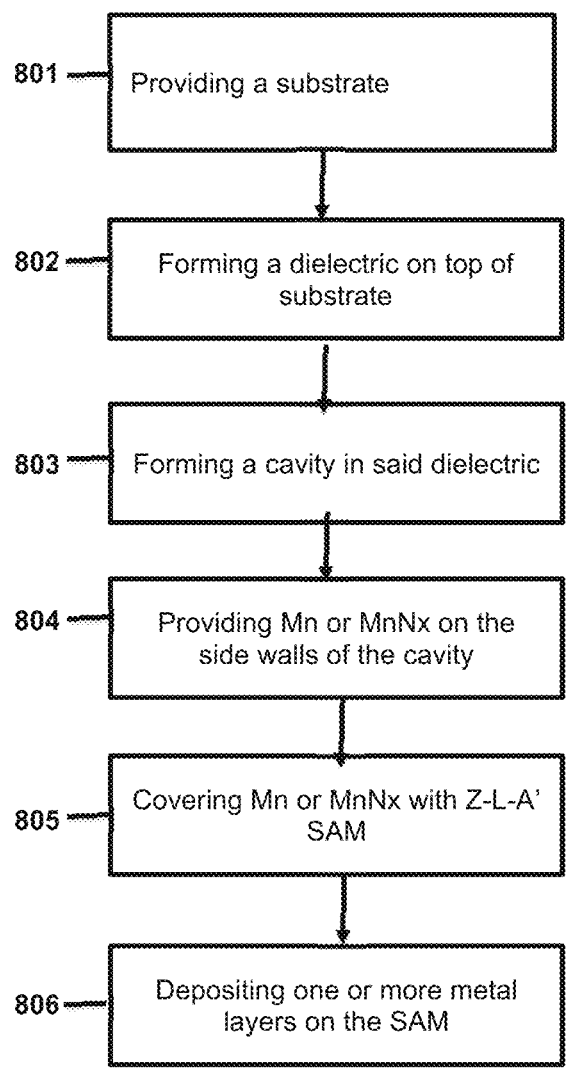
FIG. 8 is a flowchart showing steps of an embodiment of the second aspect.

FIG. 8 is a flow-chart showing a generic process according to the second aspect. It comprises the steps of providing 801 a substrate, forming 802 a dielectric on top of the substrate, forming 803 a cavity in the dielectric, providing 804 a manganese or manganese nitride layer on the side walls of the cavity, covering 805 the manganese or manganese nitride with Z-L-A' self-assembled monolayer, and depositing 806 one or more metal layers on the self-assembled monolayer.

EXAMPLE 1

Evaluation of the Protective Effect of Z-L-A SAMs Against a $Pd^{2+}$ Activation Solution Experiments have been performed in order to evaluate the protective effect of a self-assembled monolayer 3 comprising an organic compound of formula Z-L-A against dissolution of the manganese or manganese nitride layer 2. The results are summarized in the Table 1 below.

TABLE 1

|  | O | Si | C | Mn | N | Pd |
|---|---|---|---|---|---|---|
| MnN + 15 s Pd | 35.02 | 19.04 | 35.71 | 3.82 | 6.15 | 0.26 |
| MnN + 30 s Pd | 40.76 | 26.23 | 28.5 | 1.3 | 2.66 | 0.55 |
| MnN + 45 s Pd | 40.96 | 27.51 | 27.31 | 1.19 | 2.65 | 0.38 |
| MnN + 60 s Pd | 40.87 | 27.17 | 28.77 | 0.9 | 2.22 | 0.97 |
| MnN | 42.69 | 2.08 | 23.74 | 22.9 | 8.56 | 0 |
| MnN + PEDA | 32.41 | 4.67 | 42.02 | 12.27 | 8.63 | 0 |
| MnN + PEDA + 15 s Pd | 37.11 | 17.18 | 26.65 | 9.55 | 9.27 | 0.25 |
| MnN + PEDA + 30 s Pd | 40.77 | 22.51 | 22.83 | 6.25 | 7.52 | 0.17 |
| MnN + PEDA + 45 s Pd | 38.04 | 20.68 | 27.47 | 6.21 | 7.32 | 0.27 |
| MnN + PEDA + 60 s Pd | 43.74 | 28.26 | 23.21 | 2 | 2.47 | 0.33 |

The first column of this table lists the samples that have been prepared and analyzed by angle resolved x-ray photoelectron spectroscopy (AR-XPS). The six following columns (O, Si, C, Mn, N, Pd) give the concentration for each of the title atoms in at % calculated from the AR-XPS measurements by summing the intensities at all angles.

All samples comprise a 3 nm manganese or manganese nitride layer 2 (MnN) on an unpatterned Si oxide dielectric 6.

When a self-assembled monolayer 3 comprising an organic compound of formula Z-L-A is used, PEDA is indicated.

PEDA stands for (aminoethylaminomethyl)phenethyltrimethoxysilane, which is the organic compound of formula Z-L-A used to prepare these samples by dipping in a 50 mM liquid solution in methanol of the organic compound for six hours.

When the mention +xs Pd where (x is a number) is used, this stands for the number of seconds a sample has been dipped in a $Pd^{2+}$ catalyst solution at a pH of 2.

As can be seen on the fifth line of this table, a sample comprising only a 3 nm manganese or manganese nitride 2 on an unpatterned Si oxide dielectric substrate 6, and which has not been exposed to the $Pd^{2+}$ catalyst solution, is measured at 22.9 at % Mn. From the four first lines of this table, one can see that upon contacting with the $Pd^{2+}$ catalyst solution, the amount of Mn and N decreases rapidly, indicating a dissolution of the manganese or manganese nitride layer 2.

From the sixth line of that table, one can see that depositing the self-assembled monolayer 3 on the manganese or manganese nitride layer 2 decreases the detected amount of manganese. This could be due to the masking effect of the self-assembled monolayer 3 and/or to partial dissolution of the manganese or manganese nitride layer 2 during dipping in the (aminoethylaminomethyl)phenethyltrimethoxysilane solution.

The last four lines of the table clearly show that for an equal exposure time to the $Pd^{2+}$ catalyst solution at a pH of 2, the presence of the self-assembled monolayer 3 protects the manganese nitride layer 2 by reducing its tendency to dissolve in the catalyst solution.

EXAMPLE 2

Effect of the pH of the $Pd^{2+}$ Activation Solution on the MnN Layer

Experiments have been performed in order to evaluate the influence of the pH of the $Pd^{2+}$ catalyst solution on the MnN layer 5. For this purpose, five samples have been prepared. All five samples comprised an unpatterned Si oxide dielectric 6 and a 5 nm MnN layer 5. Samples 1 to 4 further comprised a layer of a self-assembled monolayer 3, comprising an organic compound of formula Z-L-A (3-Trimethoxysilylpropyl)diethylenetriamine (DETA). This self-assembled monolayer was formed by dipping each Sample 1 to 4 in a 5 mM methanol solution at room temperature. Sample 5 was kept as a reference. Samples 1 to 4 were then contacted with a $Pd^{2+}$ catalyst solution at different pHs for 3 minutes. The $Pd^{2+}$ catalyst solution at pH 7 comprises the palladium complex tetraamminepalladium (II) sulfate at 40 g/l (palladium complex S, Tanaka Kikinzoku kogyo K. K.); The $Pd^{2+}$ catalyst solution at pH 9 comprises the palladium complex tetraamminepalladium(II) dichloride at 100 g/l (palladium complex C, Tanaka Kikinzoku kogyo K. K.). The $Pd^{2+}$ catalyst solution at pH 11 comprises the palladium complex tetraamminepalladium(II) hydroxide at 20 g/l (palladium complex O, Tanaka Kikinzoku kogyo K. K.). The XPS results are summarized in the Table 2 below.

TABLE 2

| Sample | pH | O | Si | C | Mn | N | Pd |
|---|---|---|---|---|---|---|---|
| 1 | 2 | 51.33 | 28.99 | 15.13 | 3.21 | 1.22 | 0.12 |
| 2 | 7 | 40.69 | 1.72 | 19.86 | 26.07 | 11.24 | 0.41 |
| 3 | 9 | 50.45 | 2.85 | 1.48 | 33.46 | 11.54 | 0.22 |
| 4 | 11 | 42.36 | 1.45 | 18.25 | 26.35 | 10.8 | 0.79 |
| 5 (ref) | n.a. | 59.91 | 3.49 | 3.60 | 36.00 | | |

From this table, it is clear that the problem of MnN dissolution is drastically reduced by the combined use of the self-assembled monolayer 3 comprising an organic compound of formula Z-L-A and of a $Pd^{2+}$ catalyst solution at a pH above 2 and preferably of 7 or more. At pH 2, more than 90% of the manganese or manganese nitride layer 11 dissolves in 3 minutes. At pH 7-11, about 20% of the manganese or manganese nitride 11 dissolves in 3 minutes.

EXAMPLE 3

Effect of an Organic Base Contacted with the SAM on the Dissolution of the MnN Layer in Presence of $Pd^{2+}$ Catalyst Solution of Various pH In this example, the effect of contacting the self-assembled monolayer 3 comprising an organic compound of formula Z-L-A with an organic base before exposition to the $Pd^{2+}$ activation solution has been tested. For this purpose, six samples have been prepared (numbered 6 to 11). Each sample comprised an unpatterned Si oxide dielectric 6 coated with a 2 nm manganese or manganese nitride layer 2. Samples 7 to 11 were then coated with the self-assembled monolayer 3 (DETA) by dipping in a 5 mM solution in methanol at room temperature, then exposed to N,N-Diisopropylethylamine (DIPEA) in methanol for 4 h. Samples 7 to 10 were then contacted with $Pd^{2+}$ catalyst solution at different pH for 3 minutes. The XPS results are summarized in Table 3 below.

TABLE 3

| Sample | Note | O | Si | C | Mn | N | Pd |
|---|---|---|---|---|---|---|---|
| 6 | Only MnN | 51.33 | 19.17 | 14.74 | 14.34 | 0.42 | 0.01 |
| 7 | pH 2 | 50.71 | 25.05 | 16.68 | 6.68 | 0.58 | 0.3 |
| 8 | pH 7 | 49.71 | 20.06 | 16.94 | 11.99 | 0.9 | 0.41 |
| 9 | pH 9 | 48.77 | 19.15 | 18.03 | 12.77 | 0.87 | 0.41 |
| 10 | pH 11 | 49.98 | 18.96 | 16.61 | 12.95 | 0.76 | 0.73 |
| 11 | No Pd | 48.42 | 18.85 | 18.92 | 12.98 | 0.82 | 0 |

From these results, we first observe that the mere exposure to the organic base (Sample 11) has very little effect on the manganese or manganese nitride layer 2. Second, we observe that at pH 2 only 50% of the manganese or manganese nitride layer 2 dissolves. Third, we observe that at pH from 7 to 11, dissolution remains negligible. Compared to the corresponding result of Table 2, we conclude that the exposition of the self-assembled monolayer 3 to an organic base before exposition to the $Pd^{2+}$ catalyst solution has a protective effect.

EXAMPLE 4

Direct Copper Deposition with Pd Activation

Figure 5:
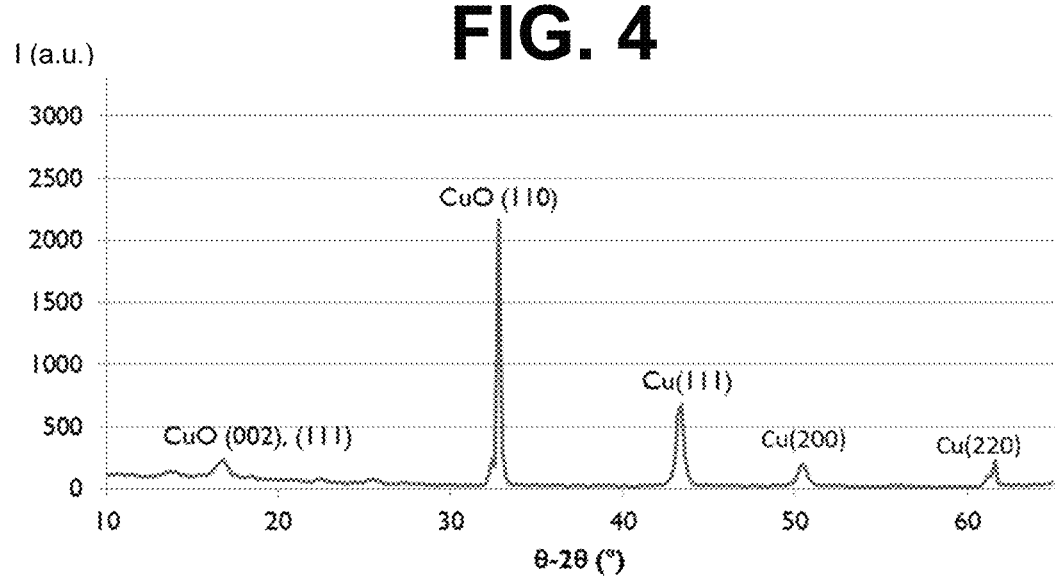
FIG. 5 is a copper XRD spectrum of a sample according to an embodiment of the first aspect.
Figure 6:
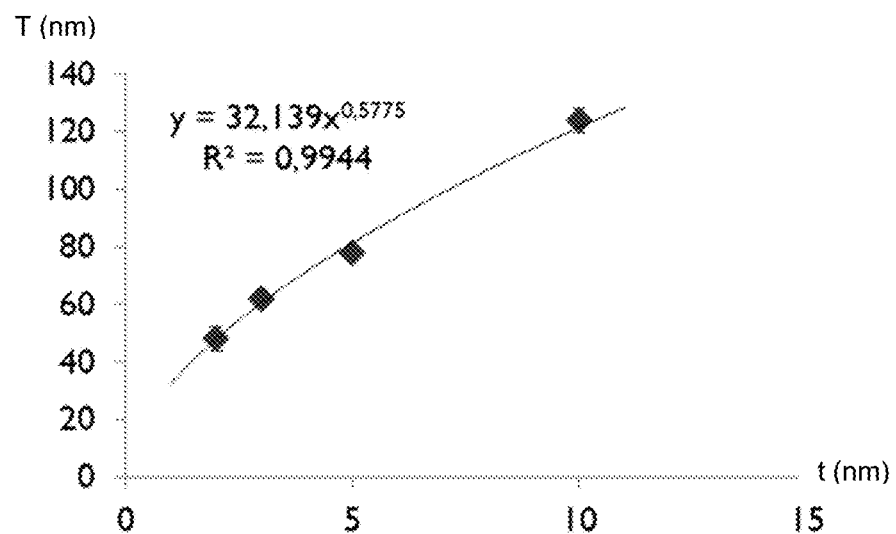
FIG. 6 is a graph of the thickness (T) in nm of the growing copper layer in function of the deposition time (t) in minutes for an embodiment.

Three samples have been prepared. Each sample comprised an unpatterned Si oxide dielectric 6 coated with a 3 nm manganese or manganese nitride layer 2 and a DETA self-assembled monolayer 3 on the manganese or manganese nitride layer 2. The DETA self-assembled monolayer 3 was deposited by dipping the samples in a 5 mM methanol solution at room temperature. Each sample was then exposed to DIPEA in methanol for 4 hours. The first sample was then exposed 3 minutes to a $Pd^{2+}$ catalyst solution at pH 11, followed by a 30 seconds exposition to an activator BI diluted 50 times, followed by a 10 minutes electroless copper deposition. The second sample was then exposed 5 minutes to a $Pd^{2+}$ catalyst solution at pH 11, followed by a 30 seconds exposition to an activator BI diluted 30 times, followed by a 5 minutes electroless copper deposition. The third sample was then exposed 3 minutes to a $Pd^{2+}$ activation solution at pH 11, followed by a 30 seconds exposition to an additive BI diluted 30 times, followed by a 10 minutes electroless copper 9 deposition. For all three samples, a uniform copper 9 deposition was achieved. After 15 minutes of annealing at 150° C., a smoother copper layer 9 was observed. The copper XRD of the first sample is shown in FIG. 5.

EXAMPLE 5

Copper Deposition Via a Nickel-Comprising Nucleation Layer

Four samples have been prepared. Each sample comprised an Si oxide dielectric coated with a 3 nm manganese or manganese nitride layer 2 and a DETA self-assembled monolayer 3 on the manganese or manganese nitride layer 2. The DETA self-assembled monolayer 3 was deposited by dipping the samples in a 5 mM methanol solution at room temperature. Each sample was then exposed to DIPEA in methanol for 4 hours. All four samples were then exposed 3 minutes to a $Pd^{2+}$ catalyst solution at pH 11, followed by the deposition of a NiB nucleation layer 11 for one minute. An electroless deposition was then performed by using a different deposition time for each sample. The deposition times ranged from 2 to 10 minutes. The results can be seen in FIG.

Figure 7:
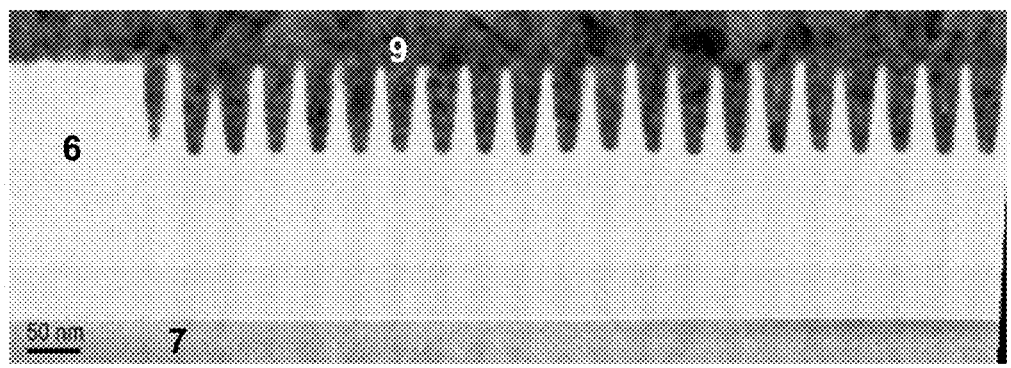
FIG. 7 is a high-angle annular dark field scanning tunneling electron microscopy (HAADF-STEM) image of an embodiment.

6 where the thickness (T) in nm of the growing copper layer 9 is represented in function of the deposition time (t) in minutes. The resulting films had a better smoothness than the films obtained in example 4. Also, the XRD (not shown) shows equivalent Cu(111)/(200)/(220) peak intensities to those observed in example 4. A notable difference is the absence of copper oxide peaks in the present case. FIG. 7 is a high-angle annular dark field scanning tunneling electron microscopy (HAADF-STEM) image of a representative sample after annealing at 100° C. for 30 minutes. Visible in this image are a substrate 7; a dielectric 6 ($SiO_2$) comprising two section: a smooth section on the left and a section comprising cavities 4 on the right; a copper layer 9 grown in the cavities. The manganese or manganese nitride layer, the self-assembled monolayer, the Pd activation layer 10 and the NiB layer 11 are not visible on this picture. The first cavity 4 on the left has a width of about 10 nm while the following cavities 4 have each a width of about 20 nm. The depth of the cavities 4 starting from the second one is about 70 nm. The aspect ratio of these cavities 4 is at about 3.5. The filling of the cavities 4 was excellent both before and after annealing. No gaps are observed between the side walls of the cavities 4 and the copper 9.

EXAMPLE 6

Copper Deposition Via a Cobalt Nucleation Layer

Example 5 was repeated except that the NiB nucleation layer 11 was replaced by a Co nucleation layer 11. The resulting copper films 9 were of equivalent quality to those obtained in Example 5.

EXAMPLE 7

Influence of a $UV/O_3$ Cleaning of the MnN on the Copper Deposition

Example 5 was repeated except that the manganese or manganese nitride layers 2 were cleaned with $UV/O_3$ before to deposit the self-assembled monolayer 3. No substantial difference could be observed.

EXAMPLE 8

Adhesion of Electroless Copper Deposited on a MnN Layer

Two methods where used to assess adhesion. Adhesion was first assessed for all samples of Examples 4 to 7 by a tape test performed by applying a "red" scotch crystal clear tape to the samples after the copper 9 deposition and pulling from the edge of each sample. All samples passed this tape test.

In order to quantify the adhesion obtained for the metal layer 9 on the manganese or manganese nitride layer 2, nine identical samples have been prepared and tested for adhesion by a four point bending method. The samples have been prepared by first, coating an unpatterned Si oxide dielectric 6 with a 3 nm manganese or manganese nitride layer 2; second, contacting the manganese or manganese nitride layer 2 with a 50 mM solution of PEDA for six hours; third, contacting the resulting sample with a $Pd^{2+}$ catalyst solution at pH 11; fourth, electroless plating of the resulting samples in a 1% wt NiB solution for two minutes; and fifth, electroless plating of the resulting samples with 70 nm of copper 9. These samples have been tested for adhesion by the four point bending split-beam method. This method was used to quantitatively determine the interfacial fracture resistance and crack velocity as a function of the mechanical energy release rate of the weakest interface in a thin-film stack. The detailed measurement procedure is fully elucidated in Tran et al. (J. Phys. D. Appl. Phys. 44 (2011) 034006. For the purpose of this method, a 300 nm CVD oxide layer was deposited on the copper. Table 4 below shows the interface energy Gc of the resulting samples before annealing (b.a.) and after annealing at 350° C. for 15 minutes under $N_2$ (a.a.).

TABLE 4

| Sample | Gc ($J/m^2$) b.a. | Gc ($J/m^2$) a.a. |
| --- | --- | --- |
| 1 | * | 4.21 |
| 2 | * | 3.07 |
| 3 | * | 3.04 |
| 4 | 1.52 | 2.95 |
| 5 | * | 3.57 |
| 6 | 1.61 | 3.44 |
| 7 | * | * |
| 8 | 1.92 | 3.39 |
| 9 | * | * |
| Mean | >1.7 | >3.4 |
| StDev | 0.2 | 0.4 |

*fracture of the epoxy glue.

In Table 4, StDev stands for the standard deviation associated to the mean value. A Gc of 3 $J/m^2$ or more shows that the adhesion of the copper to the dielectric is good.

Other arrangements for accomplishing the objectives of the invention will be obvious for those skilled in the art.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

It is to be understood that although preferred embodiments, specific constructions and configurations, as well as materials, have been discussed herein for devices according to the present invention, various changes or modifications in form and detail may be made without departing from the scope of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. An electronic circuit structure, comprising
   a substrate;
   a dielectric layer on top of the substrate, the dielectric layer comprising a cavity having side-walls;
   a manganese or manganese nitride layer covering the side-walls; and
   a self-assembled monolayer comprising an organic compound of formula Z-L-A, covering the manganese or manganese nitride layer, wherein Z is selected from the group consisting of a primary amino group, a carboxylic acid group, a thiol group, a selenol group, and a heterocyclic group having an unsubstituted tertiary amine in the cycle, wherein L is an organic linker having from 1 to 12 carbon atoms and from 0 to 3 heteroatoms, and wherein A is a group attaching the linker to the manganese or manganese nitride layer.

2. The electronic circuit structure of claim 1, wherein the substrate has a conductive element at a surface thereof and wherein the cavity exposes at least part of the conductive element.

3. The electronic circuit structure of claim 1, wherein the organic linker L has from 1 to 3 functional groups selected from the group consisting of primary amino groups and secondary amino groups.

4. The electronic circuit structure of claim 1, further comprising one or more metal layers provided on the self-assembled monolayer.

5. The electronic circuit structure of claim 4, wherein one of the one or more metal layers is a Pd layer provided on the self-assembled monolayer.

6. The electronic circuit structure of claim 5, wherein one of the one or more metal layers is a cobalt-comprising or nickel-comprising layer deposited on the Pd layer.

7. The electronic circuit structure of claim 4, wherein one of the one or more metal layers is a cobalt-comprising or nickel-comprising layer deposited on the self-assembled monolayer in an absence of a Pd layer.

8. The electronic circuit structure of claim 1, wherein one of the one or more metal layers is a Cu layer deposited on a member of the group consisting of:
  a cobalt-comprising or nickel-comprising layer;
  a Pd layer; and
  the self-assembled monolayer, in an absence of a cobalt-comprising layer, a nickel-comprising layer, and a Pd layer.

9. The electronic circuit structure of claim 1, comprising a portion of a semiconductor device.

10. A process for manufacturing an electronic circuit structure, comprising:
  providing a dielectric layer on top of a substrate, wherein the dielectric layer comprises a cavity having side-walls;
  covering the side-walls with a manganese or manganese nitride layer; and
  covering the manganese or manganese nitride layer with a self-assembled monolayer comprising an organic compound of formula Z-L-A', wherein Z is selected from the group consisting of a primary amino group, a carboxylic acid group, a thiol group, a selenol group, and a heterocyclic group having an unsubstituted tertiary amine in the cycle, wherein L is an organic linker having from 1 to 12 carbon atoms and from 0 to 3 heteroatoms, and wherein A' is a group configured for attaching the linker to the manganese or manganese nitride layer, whereby the electronic circuit structure of claim 1 is obtained.

11. The process of claim 10, further comprising:
  providing a Pd layer on the self-assembled monolayer;
  depositing a cobalt-comprising or nickel-comprising layer on the Pd layer; and
  depositing Cu on the cobalt-comprising or nickel-comprising layer.

12. The process of claim 10, further comprising:
  depositing a cobalt- or nickel-comprising layer on the self-assembled monolayer; and
  depositing Cu on the cobalt-comprising or nickel-comprising layer, in an absence of a Pd layer.

13. The process of claim 10, further comprising:
  depositing Cu on the self-assembled monolayer in an absence of a cobalt-comprising layer, a nickel-comprising layer, and a Pd layer.

14. The process of claim 11, wherein providing a Pd layer on the self-assembled monolayer comprises contacting the self-assembled monolayer with a $Pd^{2+}$ solution or with a liquid medium comprising $Pd^\circ$ nanoparticles.

15. The process of claim 11, wherein at least one of depositing a cobalt-comprising or nickel-comprising layer or depositing Cu is performed by electroless deposition.

16. The process of claim 10, wherein A' is selected from the group consisting of $SiX_3$ groups and $PO_3H_2$ groups, wherein each X is independently selected from the group consisting of H, Cl, O—$CH_3$, O—$C_2H_5$, and O—$C_3H_7$.

17. The process of claim 10, wherein the substrate comprises a conductive element at a surface thereof and wherein the cavity exposes at least part of the conductive element.

18. The process of claim 17, further comprising:
  providing a sacrificial protective layer on the exposed part of the conductive element prior to covering the manganese or manganese nitride layer with the self-assembled monolayer;
  removing the sacrificial protective layer after covering the manganese or manganese nitride layer with the self-assembled monolayer; and
  filling the cavity with one or more metal layers.

* * * * *